(12) United States Patent
Yancey

(10) Patent No.: US 12,334,301 B2
(45) Date of Patent: *Jun. 17, 2025

(54) PLASMA SOURCE AND METHOD FOR REMOVING MATERIALS FROM SUBSTRATES UTILIZING PRESSURE WAVES

(71) Applicant: Atmospheric Plasma Solutions, Inc., Cary, NC (US)

(72) Inventor: Peter Joseph Yancey, Cary, NC (US)

(73) Assignee: Atmospheric Plasma Solutions, Inc., Cary, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/383,943

(22) Filed: Oct. 26, 2023

(65) Prior Publication Data

US 2024/0055224 A1 Feb. 15, 2024

Related U.S. Application Data

(60) Continuation of application No. 17/162,681, filed on Jan. 29, 2021, now Pat. No. 11,810,756, which is a division of application No. 12/702,039, filed on Feb. 8, 2010, now Pat. No. 10,984,984.

(60) Provisional application No. 61/150,795, filed on Feb. 8, 2009.

(51) Int. Cl.
| | |
|---|---|
| *H01J 37/32* | (2006.01) |
| *B08B 7/00* | (2006.01) |
| *B44D 3/16* | (2006.01) |
| *C23G 5/00* | (2006.01) |
| *H05H 1/24* | (2006.01) |

(52) U.S. Cl.
CPC ...... *H01J 37/32009* (2013.01); *B08B 7/0035* (2013.01); *B44D 3/16* (2013.01); *C23G 5/00* (2013.01); *H05H 1/2481* (2021.05); *H05H 1/2487* (2021.05)

(58) Field of Classification Search
None
See application file for complete search history.

(56) References Cited

U.S. PATENT DOCUMENTS

| 4,861,352 A * | 8/1989 | Cheng | B01J 19/26 95/263 |
| 5,414,324 A * | 5/1995 | Roth | H05B 7/16 315/111.21 |
| 5,573,682 A * | 11/1996 | Beason, Jr. | H05H 1/34 427/446 |

(Continued)

FOREIGN PATENT DOCUMENTS

| WO | WO-0069554 A1 * | 11/2000 | B01J 19/0046 |
| WO | WO-2006007437 A1 * | 1/2006 | B08B 7/0035 |

*Primary Examiner* — Sylvia MacArthur
(74) *Attorney, Agent, or Firm* — Olive Law Group, PLLC

(57) ABSTRACT

In a method is provided for removing a material from a substrate, a plasma is generated at atmospheric pressure. The plasma includes an energetic species reactive with one or more components of the material. The plasma is flowed from an outlet as a plasma plume that includes periodic regions of high plasma density and low plasma density. The material is exposed to the plasma plume. At least one component of the material reacts with the energetic species, and at least one other component of the material is physically impacted and moved by one or more of the regions of high plasma density.

10 Claims, 10 Drawing Sheets

(56) References Cited

U.S. PATENT DOCUMENTS

| | | | | |
|---|---|---|---|---|
| 5,723,027 | A * | 3/1998 | Serole | B01J 19/088 |
| | | | | 422/186.04 |
| 5,976,992 | A * | 11/1999 | Ui | C23C 16/452 |
| | | | | 427/579 |
| 6,452,315 | B1 * | 9/2002 | Vane | H01J 37/32082 |
| | | | | 315/111.21 |
| 10,984,984 | B2 * | 4/2021 | Yancey | B44D 3/16 |
| 11,810,756 | B2 * | 11/2023 | Yancey | B44D 3/16 |
| 11,974,385 | B2 * | 4/2024 | Rogers | H01F 27/385 |
| 2002/0168466 | A1 * | 11/2002 | Tapphorn | B05B 7/144 |
| | | | | 427/454 |
| 2005/0081920 | A1 * | 4/2005 | Rimondo | F23N 1/007 |
| | | | | 137/487.5 |
| 2007/0029500 | A1 * | 2/2007 | Coulombe | H01T 23/00 |
| | | | | 250/423 F |
| 2024/0055224 | A1 * | 2/2024 | Yancey | C23G 5/00 |

* cited by examiner

PLASMA SOURCE AND METHOD FOR REMOVING MATERIALS FROM SUBSTRATES UTILIZING PRESSURE WAVES

RELATED APPLICATIONS

This application is a continuation of U.S. Nonprovisional patent application Ser. No. 17/162,681, filed Jan. 29, 2021, and titled "PLASMA SOURCE AND METHOD FOR REMOVING MATERIALS FROM SUBSTRATES UTILIZING PRESSURE WAVES" (projected to issue as U.S. Pat. No. 11,810,756 on Nov. 7, 2023), which is a divisional of U.S. Nonprovisional patent application Ser. No. 12/702,039, filed Feb. 8, 2010, and titled "PLASMA SOURCE AND METHOD FOR REMOVING MATERIALS FROM SUBSTRATES UTILIZING PRESSURE WAVES" (issued as U.S. Pat. No. 10,984,984), which claims the benefit of U.S. Provisional Patent Application Ser. No. 61/150,795, filed Feb. 8, 2009, titled "COATING REMOVAL DEVICE AND METHODS"; the contents of which are incorporated by reference herein in their entireties.

TECHNICAL FIELD

The present invention generally relates to the removal of materials from substrates utilizing atmospheric pressure plasma.

BACKGROUND

Atmospheric pressure (AP) plasma may be utilized to remove a coating of material (e.g., a layer, film, paint, etc.) from the surface of a substrate. The source of the AP plasma may be device configured to discharge an AP plasma plume from a nozzle. The device may positioned at some specified distance between the nozzle and the surface of the coating, and oriented so as to direct the AP plasma plume toward the coating. While the AP plasma plume is active, the device may be moved across the coating along an appropriate path to effect removal of the coating or a desired portion thereof.

The coating may include a combination of components, some of which are readily removable by a conventional AP plasma (reactive or plasma-responsive components) and some of which are not (non-reactive or non-responsive components). An example is a coating or paint that includes organic or polymeric components that are reactive to one or more energetic species of the AP plasma, but also includes inorganic pigments and fillers that are generally not responsive to the AP plasma. As a conventional AP plasma is applied to such a coating, loosely bonded inorganic components begin to build up and serve as an etch-resistant layer or diffusion barrier to the activated chemical species of the AP plasma plume. Consequently, the material removal rate and hence the effectiveness of the conventional AP plasma device rapidly become diminished (e.g., within milliseconds). Conventionally, the solution has been to cease application of the AP plasma plume, brush the surface with a brush or rough cloth in an attempt to sweep away the build-up, and then resume application of the AP plasma plume to reach additional layers of coating requiring removal, and often make additional passes over areas previously obstructed by the build-up. Depending on the thickness and composition of the material being removed from the underlying substrate, these iterations need to be repeated a number of times until the material is completely removed from the substrate.

In view of the foregoing, there is a need for AP plasma sources and methods for efficiently removing various types of materials from substrates without being impaired by certain components of such materials that typically are not reactive with energetic species of the AP plasma.

SUMMARY

To address the foregoing problems, in whole or in part, and/or other problems that may have been observed by persons skilled in the art, the present disclosure provides methods, processes, systems, apparatus, instruments, and/or devices, as described by way of example in implementations set forth below.

According to one implementation, a method is provided for removing a material from a substrate. A plasma is generated at atmospheric pressure. The plasma includes an energetic species reactive with one or more components of the material. The plasma is flowed from a nozzle exit, or from a slot-shaped plasma outlet, as a plasma plume that includes periodic regions of high plasma density and low plasma density. The material is exposed to the plasma plume. At least one component of the material reacts with the energetic species, and at least one other component of the material is physically impacted and moved by one or more of the regions of high plasma density.

According to another implementation, an atmospheric pressure plasma source is provided. The plasma source is configured for generating a plasma plume that includes periodic regions of high plasma density and low plasma density.

According to another implementation, an atmospheric pressure plasma source is provided. The plasma source includes a plasma-generating chamber, an electrode extending into the plasma-generating chamber, a plasma outlet communicating with the plasma-generating chamber, and a component configured for flowing from the plasma outlet a plasma plume comprising energetic plasma species and periodic regions of high plasma density and low plasma density.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 1:
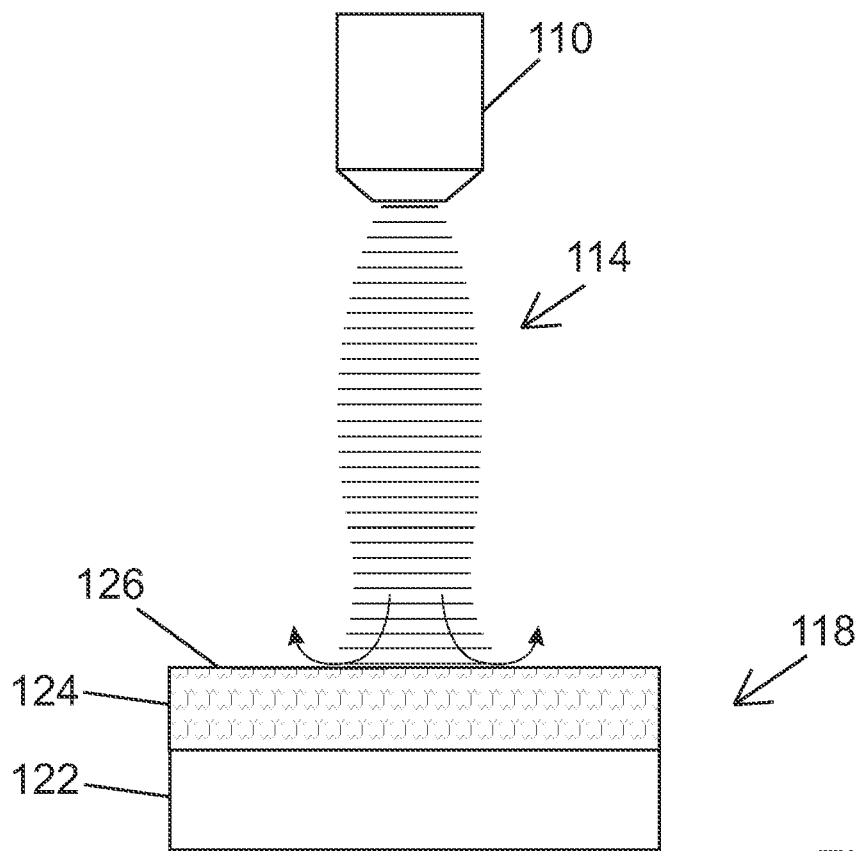
FIG. 1 illustrates an example of utilizing a conventional AP plasma source.

As used herein, the term "plasma" generally refers to a (partially) ionized gas-like mass comprising a mixture of ions, electrons and neutral species. The term "atmospheric pressure," in the context of "atmospheric pressure plasma," is not limited to a precise value of pressure corresponding exactly to sea-level conditions. For instance, the value of "atmospheric pressure" is not limited to exactly 1 atm. Instead, "atmospheric pressure" generally encompasses ambient pressure at any geographic location and thus may encompass a range of values less than and/or greater than 1 atm as measured at sea level. Generally, an "atmospheric pressure plasma" is one that may be generated in an open or ambient environment, i.e., without needing to reside in a pressure-controlled chamber or evacuated chamber.

As used herein, a "non-thermal plasma" generally refers to a plasma exhibiting low temperature ions (relative to a "thermal" plasma) and high electron temperatures relative to the temperature of the surrounding gas. A non-thermal plasma is distinguished from a thermal plasma in that a thermal plasma exhibits a higher overall energy density and both high electron temperatures and high ion and neutral temperatures.

As used herein, the term "coating" generically refers to any material desired to be removed from an underlying substrate. The term "coating" is used interchangeably with like terms such as layer, film, paint, etc.

As used herein, the term "substrate" generically refers to any structure that includes a surface on which a coating has been applied. The substrate may present a surface having a simple planar or curved geometry or may have a complex or multi-featured topography. Typically, the substrate is of the type for which it is desired not be adversely affected by the coating removal operations contemplated in the present disclosure.

For purposes of the present disclosure, it will be understood that when a layer (or coating, film, region, substrate, component, device, or the like) is referred to as being "on" or "over" another layer, that layer may be directly or actually on (or over) the other layer or, alternatively, intervening layers (e.g., buffer layers, transition layers, interlayers, sacrificial layers, etch-stop layers, masks, electrodes, interconnects, contacts, or the like) may also be present. A layer that is "directly on" another layer means that no intervening layer is present, unless otherwise indicated. It will also be understood that when a layer is referred to as being "on" (or "over") another layer, that layer may cover the entire surface of the other layer or only a portion of the other layer. It will be further understood that terms such as "formed on" or "disposed on" are not intended to introduce any limitations relating to particular methods of material transport, deposition, fabrication, surface treatment, or physical, chemical, or ionic bonding or interaction. The term "interposed" is interpreted in a similar manner.

According to some implementations disclosed herein, an AP plasma source is configured for material removing operations, including for example the removal of polymeric coatings, paints, or the like from substrates or structures of any type. The AP plasma source is configured to exhibit exceptionally high etching rates with minimal transfer of heat to the underlying substrate. The AP plasma source generates one or more plasma plumes or jets that include one or more energetic, chemically reactive species of a type effective for removing a coating composition of interest. Unlike conventional AP plasmas, the plasma plume taught in the present disclosure additionally exhibits areas of periodically increasing (high) and decreasing (low) plasma density. Without wishing to be bound by any one particular theory, it is postulated herein that this periodic plasma density contributes to enhanced removal rates observed, and that the plasma plume may be characterized as exhibiting pressure waves or pressure fronts, which in some implementations may be further characterized as shock waves or shock fronts that may be observed as supersonic shock diamonds or Mach disks. When the AP plasma source is operated to apply the plasma plume to a material to be removed, the shock waves (or other type of pressure waves) generated in the plasma plume physically disrupt the loosely adhered build-up on the material. As the plasma plume is rastered across the surface of the material (or, equivalently, when the material is moved relative to the plasma plume), the as-generated shock wave or pressure wave interacts with the loosely adhered residue and the residue is consequently ejected from or blown off the surface. Accordingly, the AP plasma source effects material removal by way of a dual modality, one being the chemical (e.g., oxidizing) interaction of the activated plasma species of the plasma plume with the coating and the other being the physical interaction of the shock wave or pressure wave structures of the plasma plume with the coating. The AP plasma source and associated methods overcome the limitations of conventional techniques by enabling inorganic or other typically unresponsive components to be rapidly broken up or peeled away, thereby continuously revealing fresh new surfaces of the coating for treatment by the activated species of the plasma.

FIG. 1 illustrates an example of utilizing a conventional AP plasma source. Specifically, FIG. 1 illustrates a nozzle 110 of the conventional AP plasma source (not shown) applying a conventional plasma plume 114 to a typical coated structure 118. The coated structure 118 generally includes a substrate 122 and a coating or layer 124 of material desired to be removed cleanly from the substrate 122 without damaging the substrate 122. The conventional plasma plume 114 is shown interacting with a top surface 126 of the coating 124 but is not effective for removing all components of the coating 124. The conventional plasma plume 114 produces no shock wave (or other type of useful pressure wave) and thus applies no appreciable force to the surface 126 effective to disrupt bound inorganic particles or other components unresponsive to the conventional plasma treatment.

Figure 2:
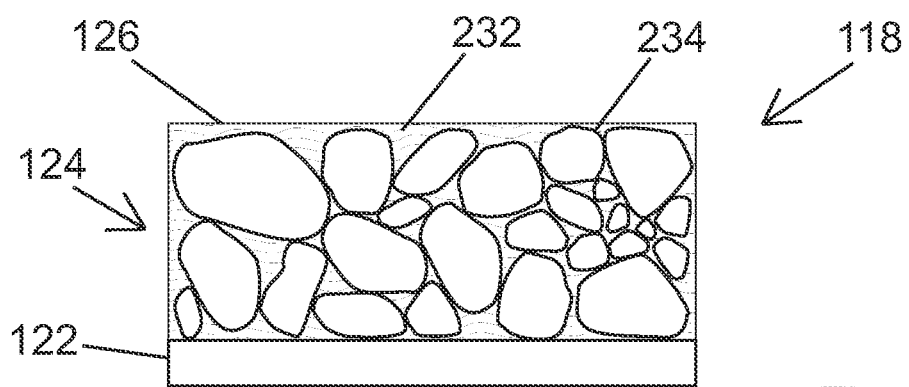
FIG. 2 is a cross-sectional elevation view of a portion of a typical coated structure to which AP plasma may be applied.
Figure 3:
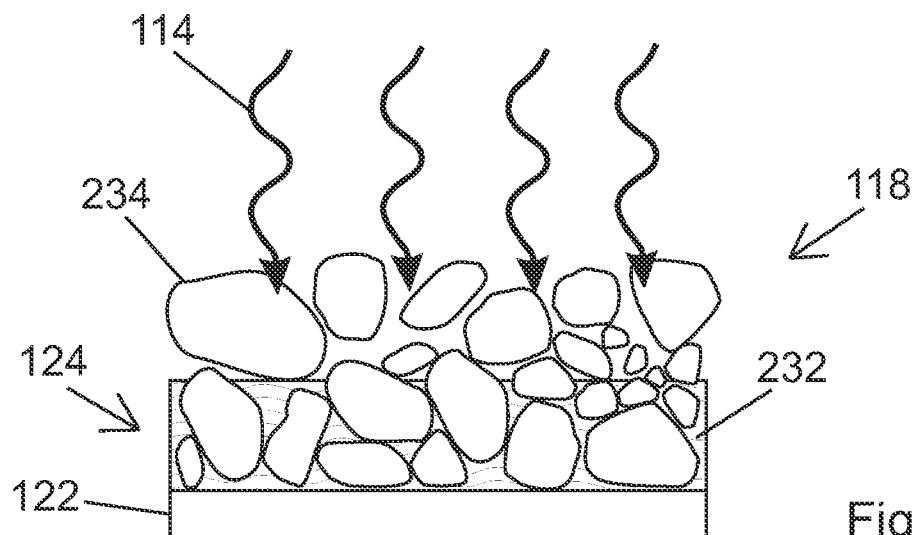
FIG. 3 is a cross-sectional elevation view of the coated structure illustrated in FIG. 2 while initially subjected to a conventional plasma.
Figure 4:
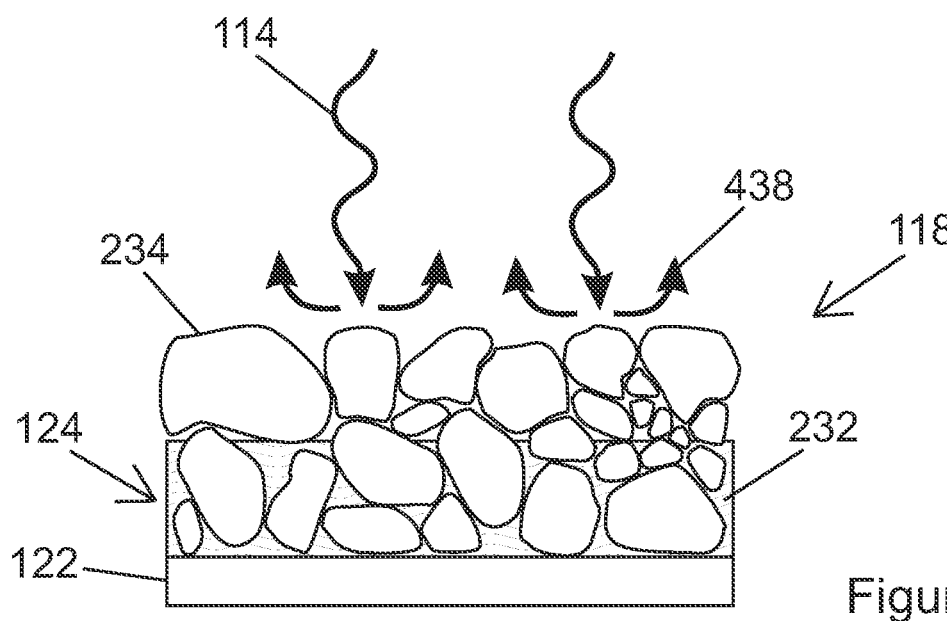
FIG. 4 is a cross-sectional elevation view of the coated structure illustrated in FIG. 2 while undergoing the conventional plasma treatment after a very brief period of time.

The conventional technique is further illustrated in FIGS. 2, 3 and 4. FIG. 2 is a cross-sectional elevation view of a portion of the coated structure 118 to which AP plasma may be applied. In this example, the coating 124 includes a matrix of organic binder material 232 and inorganic pigment and/or filler particles 234 adhered to the substrate 122. FIG. 3 is a cross-sectional elevation view of the coated structure 118 illustrated in FIG. 2 while initially subjected to the conventional AP plasma 114. The conventional plasma 114 is able to effectively remove some organic material 232, and possibly some material surrounding the inorganic particles 234, but only in the uppermost region of the coating 124 nearest to the plasma source. FIG. 4 is a cross-sectional elevation view of the coated structure 118 illustrated in FIG. 2 while undergoing the conventional plasma treatment after a very brief period of time. In a time period typically less than 1 second (and often only a few milliseconds), the conventional plasma 114 will cease to remove organic binder 232 due to the blocking effect of the inorganic particles 234. The plasma 114 and low-velocity air stream feeding the 114 plasma do not provide sufficient physical force to disrupt the loosely bound inorganic particles 234. As depicted by arrows 438, the plasma 114 and associated ionized species are reflected from the uppermost surface and can do no further work.

Figure 5:
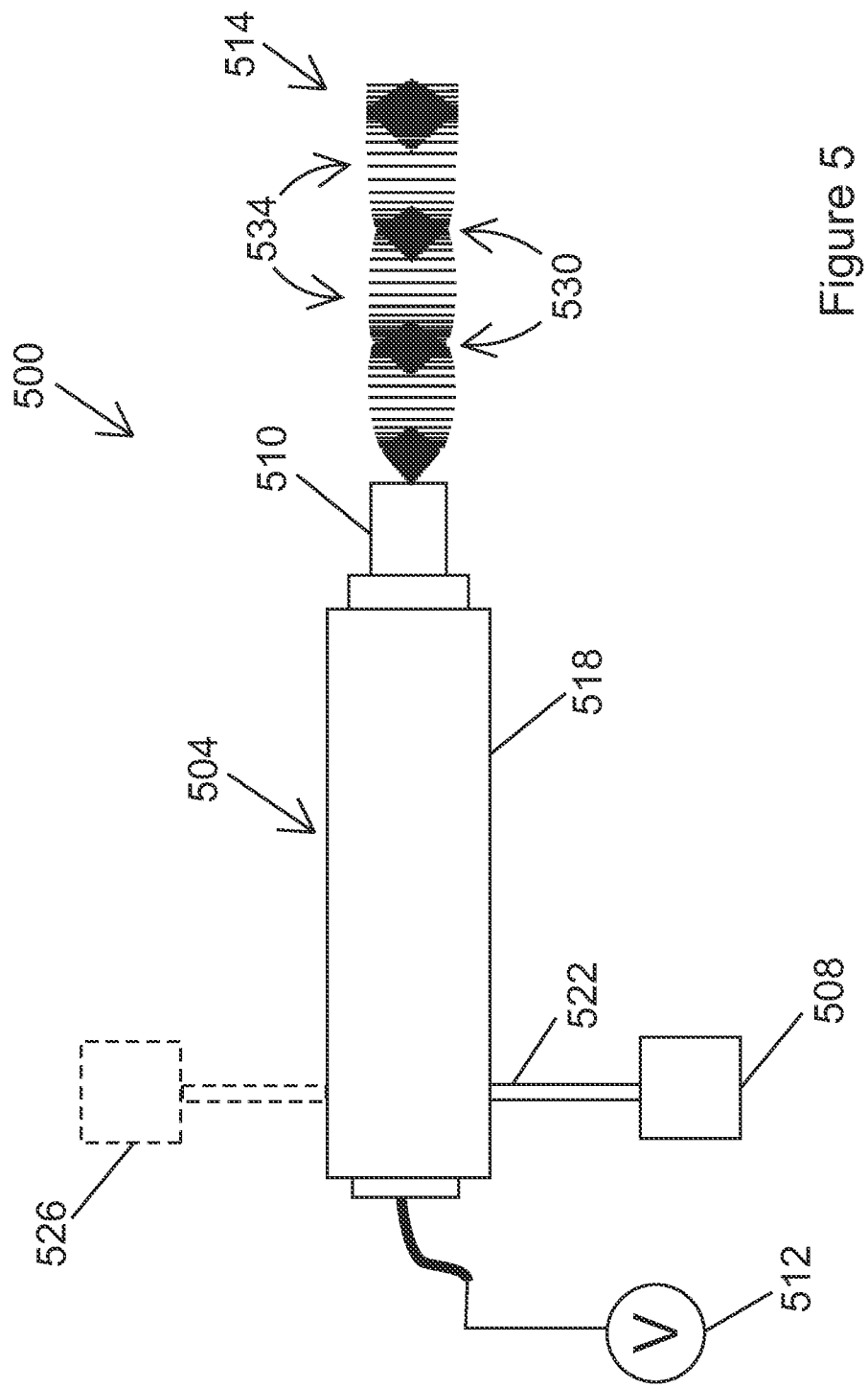
FIG. 5 is a diagram of an example of an AP plasma application system according to implementations disclosed herein.

FIG. 5 is a diagram of an example of an AP plasma application system 500 according to implementations disclosed herein. The system 500 generally includes an AP plasma source 504 (or device, applicator, apparatus, instrument, pen, gun, etc.), a plasma-generating gas supply source 508, and a power source 512. The AP plasma source 504 generally includes a main body 518 (or support structure, housing, etc.) which may be configured for manual use (i.e., handheld) or automated use (e.g., attached to a multi-axis robotics system, not shown). For manual operation, a portion of the main body 518 may be utilized as a handle. The AP plasma source 504 further includes a plasma outlet at its distal end from which a plume or jet 514 of AP plasma is generated according to various implementations disclosed herein. In the implementation illustrated in FIG. 5, the plasma outlet is the exit of a nozzle 510. The plasma-generating gas supply source 508 is in fluid communication with a gas inlet 522 of the AP plasma source 504 by any suitable conduit and fittings for supplying a suitable plasma-generating gas to the AP plasma source 504. In one example, the plasma-generating gas is air, in which case the plasma-generating gas supply source 508 may be a source of low-pressure compressed air. The power source 512 is in electrical communication with the AP plasma source 504 by any suitable wiring and connectors for supplying electrical power according to operating parameters suitable for generating and maintaining the type of AP plasma described herein. In FIG. 5, the power source 512 represents the electronics and user controls needed for this purpose. As appreciated by persons skilled in the art, the user controls may be configured as necessary to enable the setting and adjustment of various operating parameters of the voltage or current signal fed to the AP plasma source such as, for example, power level, drive voltage amplitude, drive frequency, waveform shape, etc. Electrical signals of AC (e.g., RF), DC, pulsed DC, or arbitrary periodic waveforms with or without an applied DC offset may be utilized to drive the AP plasma as appropriate for a particular application. For simplicity, internal components of the main body 518 of the AP plasma source 504 utilized for receiving the electrical and gas inputs and generating the AP plasma therefrom (e.g., electrodes, gas conduits, etc.) are omitted in FIG. 5 but readily understood by persons skilled in the art. In the case of an air plasma, the plasma-generating gas supply source 508 may also serve as the source of active species of the AP plasma (e.g., oxygen- and nitrogen-based species). Alternatively, one or more reactive gas supply sources 526 may also be placed in communication with the AP plasma source 504 for such purposes as enhancing the supply of $O_2$ or $N_2$ or for supplying other types of reactive species (e.g., He, Ar, other noble gases, halogens, $NH_3$, $CO_2$, various hydrocarbons, etc.) to specifically tailor the chemical species for a given coating type. Alternatively, specific mixtures of either noble or non-noble gases may be combined in order to enhance the ionization of secondary, tertiary, or quaternary, species or reactions by a process such as Penning ionization.

The plasma generated by the AP plasma source 504 may be a cold, or non-thermal, plasma containing one or more reactive species suitable for chemically interacting with a coating in a manner sufficient for causing the coating to be removed from its underlying substrate. Generally, the reactive species may include photons, metastable species, atomic species, free radicals, molecular fragments, monomers, electrons, and ions. The reactive species desired to be produced will generally depend on the type of coating to be removed. In the case of various polymeric coatings and paints, a highly oxidizing plasma has been found to be effective, in which case the predominant reactive species may include O, $O_2^*$ (the asterisk designating the metastable form of diatomic oxygen), and/or $O_3$. In various implementations, air supplied by the plasma-generating gas supply source 508 may be sufficient for generating an effective amount of oxygen-based energetic species for removing various types of polymeric coatings or paints. Additional non-limiting examples of active species that may be formed in the plasma and utilized for material removal include fluorine, chlorine, bromine, iodine, nitrogen, or sulphur. One or more of these species may be utilized, for example, to selectively etch (or enhance the etching selectivity of) a primer layer or adhesion layer if a specialized chemistry or primer formulation has been employed in the coated structure. For example, in the case of a primer that exhibits preferential etching by oxygen, oxygen species could be used so that the primer layer is preferentially etched relative to a topcoating layer. The oxidizer may also be mixed with an inert gas or relatively inert gas such as nitrogen or natural air mixtures. It is also possible to use reducing plasma species such as hydrogen or ammonia. It is also possible to use neutral or inert gases to energetically bombard the interface layer and promote decohesion at the bond line. The type of oxidizing species in the plasma plume may be adjusted for specific coating chemistries to maximize the etch rate of the coating. For instance, certain coating chemistries may be quite resistant to an oxygen-containing oxidizer but could be quite easily etched by a fluorinated oxidizer.

As further illustrated in FIG. 5, the plasma plume 514 generated by the AP plasma source 504 may be configured as a periodic or alternating series of high plasma density regions 530 and low plasma density regions 534. The high plasma density regions 530 may be considered as including shock fronts (or other types of pressure waves) that propagate in the general direction of the plasma plume 514, i.e., toward a target coating to be removed. Under appropriate operating conditions, the shock fronts may be visually manifested as shock diamonds or Mach disks.

Certain pressure regimes, geometrical configurations, and other operational parameters will give rise to suitable plasma and shock wave generation and control. In one implementation, the nozzle 510 is configured to cause rapid expansion of the gas emanating therefrom. As an example, the nozzle 510 may have a converging or converging-diverging configuration of appropriate dimensions. In this case, the AP plasma generated within the AP plasma source 504 flows from the nozzle exit at supersonic velocity and at a pressure different from (less than or greater than) the ambient pressure outside the nozzle exit. Another example of a nozzle that may be suitable is a non-axially symmetric nozzle such as an aerospike nozzle. In another implementation, the drive frequency and/or power level applied by the power source 512 to the electrical field generating the plasma are controlled so as to modulate the pressure waves (e.g., compression waves) generated in the AP plasma source 504. Pressure waves generated in such manner may be, or be similar to, acoustic shock waves or pressure waves. Similarly, this may be accomplished inductively by generating a time-varying magnetic field to modulate the plasma. In another implementation, the geometry of the AP plasma source 504 (e.g., the volume and the length-to-width ratios of the nozzle 510 and/or upstream plasma-generating chamber) may be selected or adjusted so as to selectively filter or enhance certain frequency modes in the pressure waves of the plasma. This may be analogous to causing acoustic gain or resonance to occur to further enhance the coherency of the shock waves. In another implementation, a piezoelectric material, such as for example various known ceramics or polymers (e.g., barium titanate, lead zirconium titanate, polyvinylidene fluoride, etc.) may be driven by the power source 512 to produce vibrations or oscillations transferred to the as-generated plasma plume. In another implementation, the supply gas pressure to the plasma plume may be modulated in order to create the necessary pressure waves or shockwaves by rapidly actuating a high speed gas valve. For example, a pneumatically actuated valve, electrically actuated valve or piezoelectric valve actuator may be used to modulate the pressure being fed into the AP plasma device.

Generally, operating parameters associated with the AP plasma source 504 are selected so as to produce a stable plasma discharge, with the pressure/shock waves as desired. The operating parameters will depend on the particular application, which may range, for example, from nanoscale etching of micro-fabricated structures or devices (e.g., MEMS devices) to removing large areas of paint from aircraft carriers. Examples of operating parameters will now be provided with the understanding that the broad teachings herein are not limited by such examples. In the case of generating an air plasma, the rate at which the air is fed to the AP plasma source 504 may range from $1 \times 10^{-6}$ SCCM to $1 \times 10^{6}$ SCCM. The feed pressure into the AP plasma source 504 may range from 1 Pa to $1 \times 10^{7}$ Pa. The power level of the electrical field driving the plasma may range from $1 \times 10^{-6}$ W to $1 \times 10^{6}$ W. The drive frequency of the electrical field may range from DC (0 GHz) to 100 GHz. The separation distance, i.e. the distance from the nozzle exit to the exposed surface of the material to be removed, may range from $1 \times 10^{-6}$ m to 1 m. The scan speed, i.e. the speed at which the AP plasma source 504 is rastered across (over) the surface of the material, may range from $1 \times 10^{-4}$ m/s to 10 m/s. Related to the scan speed and power is the time averaged power density. Also related to the scan speed is the dwell time, i.e., the period of time during which a particular area of the material is exposed to the plasma plume, which may range from $1 \times 10^{-9}$ s to $43 \times 10^{3}$ s (1 month). It will be noted that scan speed (or dwell time) effectively characterizes two different techniques for exposing the material to the plasma plume 514, the first being moving the AP plasma source 504 relative to the material (i.e., the material remains in a fixed position) and the second being holding the AP plasma source 504 stationary while moving the coated structure relative to the AP plasma source 504. The foregoing parameters may depend on the composition and thickness of the material to be removed.

Figure 6:
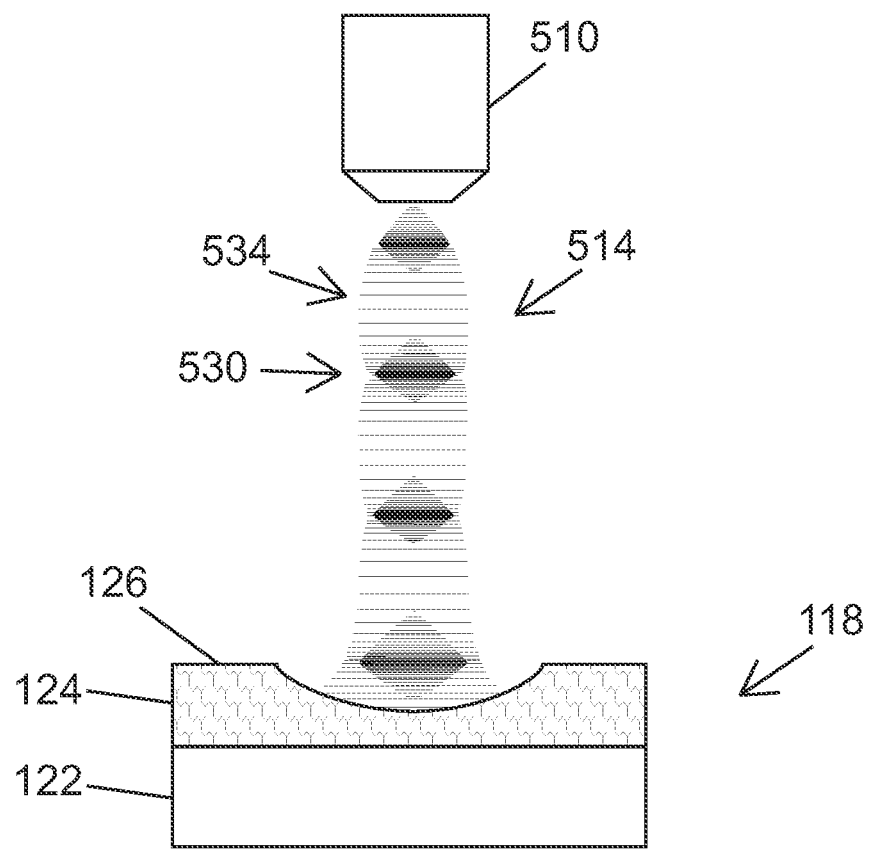
FIG. 6 illustrates an example of utilizing the AP plasma source illustrated in FIG. 5.

FIG. 6 illustrates an example of utilizing the AP plasma source 504 illustrated in FIG. 5. Specifically, FIG. 6 shows the nozzle 510 applying the shock wave-inclusive plasma plume 514 to the same or similar coated structure 118 described above in conjunction with FIGS. 1-4. Reactive components of the coating material 124 are removed by the active species of the AP plasma. For example, organic compounds may be converted to $CO_2$ and/or water vapor. In addition, the shock waves 530 (or pressure waves) generated in the AP plasma propagate toward the coated structure 118 and impinge on the uppermost surface 126 of the coating 124. The shock waves 530 disrupt inorganic particles or any other particles which a plasma unassisted by shock waves would fail to remove by sole reliance on active plasma species or incident gas flow pressure. The loosened particles may then be swept away in the gas (e.g., air) stream emanating from the AP plasma source 504 (as part of the plume 514) and may be disposed of by any suitable means (e.g., a vacuum device). Due to the bimodal activity of the shock-assisted plasma plume 514—i.e., a combination of reactive species and shock waves 530 in the plasma—the AP plasma source 504 may be operated on a continuous basis to rapidly penetrate the coated structure 118 of any thickness down to the substrate 122. Unlike conventional plasmas, the plasma plume 514 disclosed herein is not impaired by any accumulation of non-reactive or unresponsive components of the coating 124 and thus its optimized material removal rate may be preserved throughout the removal operation.

Figure 7:
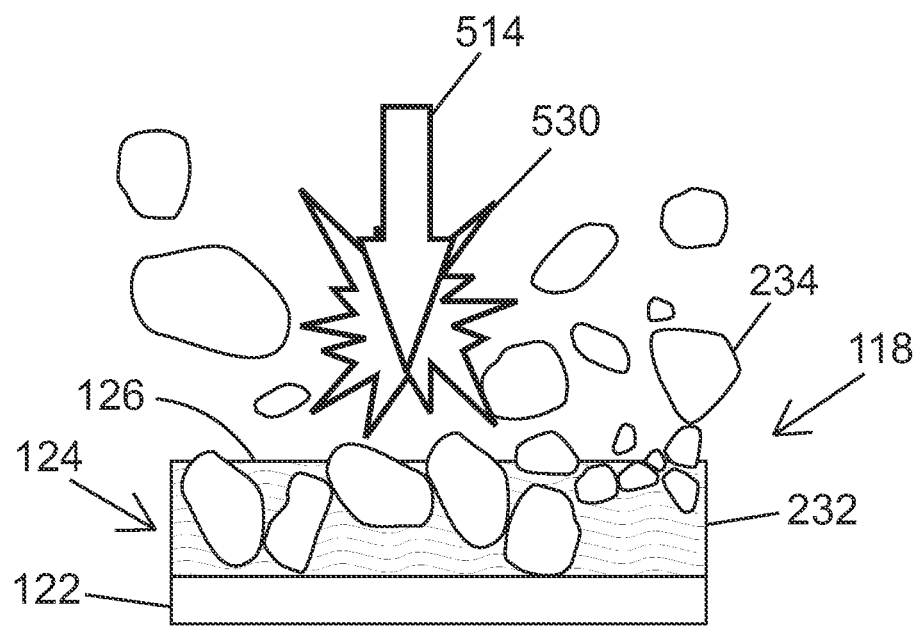
FIG. 7 is a cross-sectional elevation view of the coated structure while being subjected to a shock-wave or pressure-wave assisted plasma plume at a given instance of time.
Figure 8:
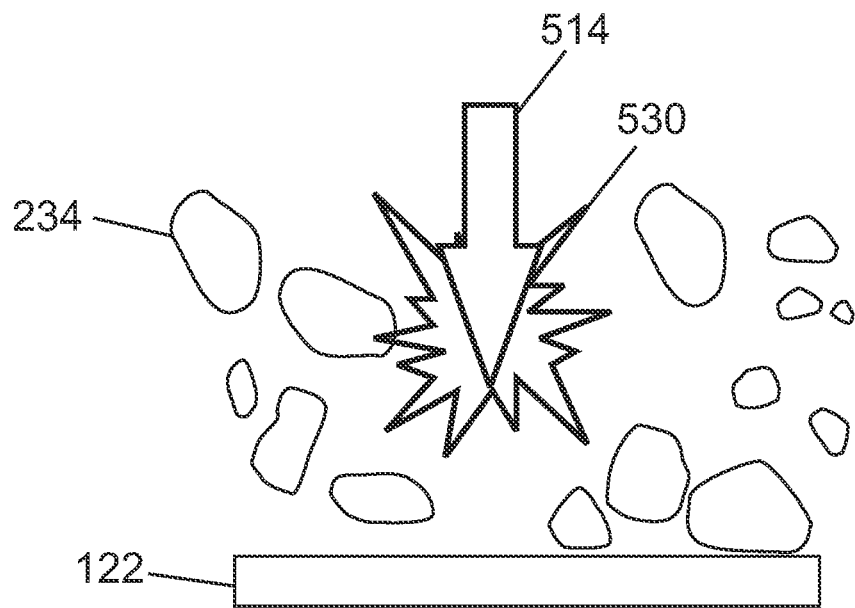
FIG. 8 is a cross-sectional elevation view of the coated structure illustrated in FIG. 7 at a later instance of time.

The technique taught herein is further illustrated in FIGS. 7 and 8. FIG. 7 is a cross-sectional elevation view of the coated structure 118 while being subjected to the shock-assisted plasma plume 514 at a given instance of time, and FIG. 8 is a similar view of the coated structure 118 at a later instance of time. The coated structure 118 in this example is the same or similar to that illustrated in FIGS. 2-4. FIG. 8 illustrates the physical disruption of particles 234 as a result of the intense physical impingement of shock waves 530 on the surface 126 of the coating 124. The pressure gradients associated with these shock waves 530 may thus be quite significant. The physical disruption helps to expose new organic layers of the coating 124, which are now free to be subsequently removed by the energetic species of the AP plasma. As shown in FIG. 8, eventually all of the binder 232 (FIG. 7) is ablated and successive shock waves 530 release all inorganic particles 234 down the surface of the substrate 122.

The substrate 122 underlying the material 124 to be removed may have any composition, e.g., metallic, polymeric, ceramic, composite, etc. Moreover, generally no limitation is placed on the type or composition of the material 124 to be removed. As noted above, the material 124 will generally be one in which at least some of the components are responsive to active species of the AP plasma while other components may not be responsive and thus are removed primarily or exclusively by the pressure waves 530 generated in the AP plasma as taught herein. Such materials 124 include, for example, various types of polymeric coatings and paints. Generally, no limitation is placed on the thickness of either the substrate 122 or the material 124 to be removed from the substrate 122. Moreover, the substrate 122 and associated material 124 to be removed are not required to have a simple planar or curvilinear geometry. Instead, the AP plasma source 504 is effective for treating three-dimensional topographies, irregular profiles, and complex geometries. The AP plasma source 504 may be utilized to apply the plasma plume 514 around structural features such as, for example, rivets, or inside narrow channels, or in corners or cracks, etc.

It will also be understood that a "material," "coating," "layer," "film" or the like as used herein encompasses multi-layered, single-layer, or composite materials. For instance, a given polymeric material may include a protective overcoat, an adhesion-promoting layer, or the like. A paint may include a primer layer, a topcoat, etc. The AP plasma source 504 is effective for all such layers or strata of a multi-layered material down to the underlying substrate. The AP plasma source 504 may also be utilized to precisely remove one or more selected layers of a multi-layered material, leaving underling layers intact on the substrate.

Figure 9:
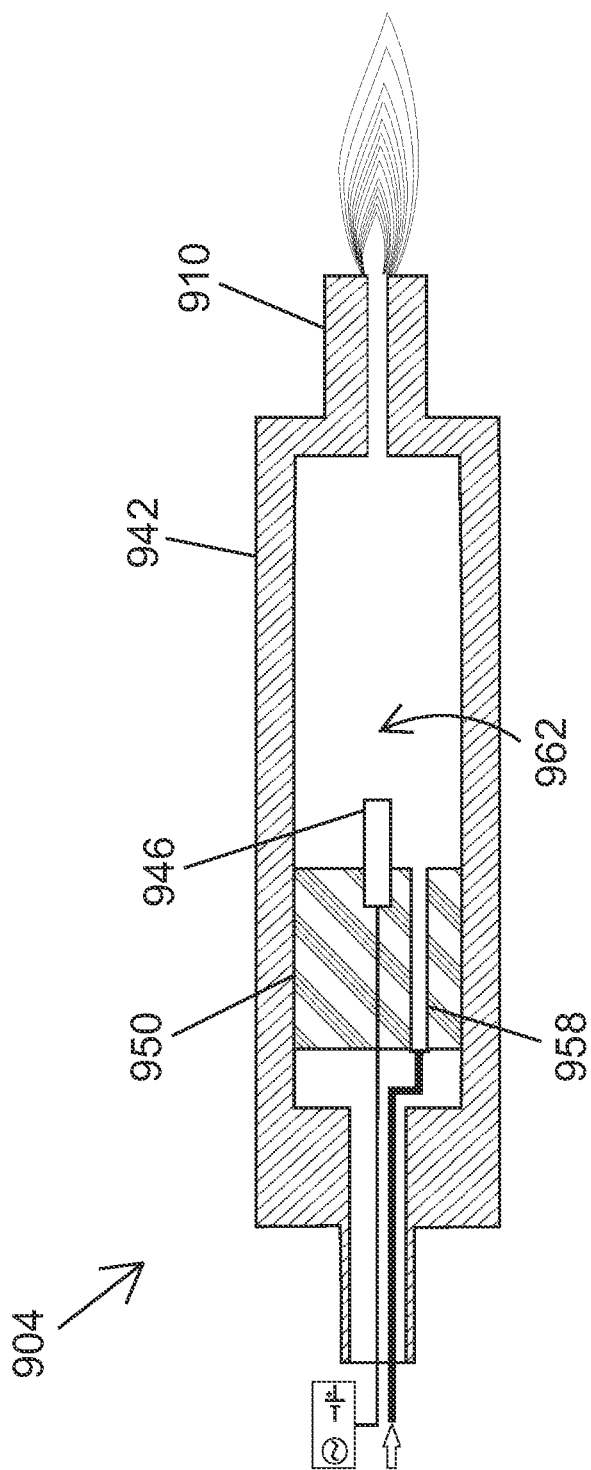
FIG. 9 is a lengthwise cross-sectional view of an example of an AP plasma source that may be configured for producing shock waves or pressure waves in the plasma plume.

FIG. 9 is a lengthwise cross-sectional view of an example of an AP plasma source 904 that may be configured for producing shock waves in the plasma plume. The AP plasma source 904 includes an axially elongated plasma-generating chamber 942 or other structure that serves as a ground electrode for generating plasma and as a conduit for flowing gases and plasma. The plasma-generating chamber 942 may be enclosed in an electrically- and thermally-insulating housing (not shown). A "hot" or powered electrode 946 is located in the plasma-generating chamber 942. Electrical connections to the hot electrode 946 may be made through a dielectric structure 950 located at the proximal end of or in the plasma-generating chamber 942. One or more gas inlets 958 may be formed through the dielectric structure 950 in fluid communication with the plasma-generating chamber 942. The gas inlets 958 may be placed in fluid communication with the gas supply source 508 (FIG. 5). Accordingly, the gas inlets 958 provide a flow path for plasma-generating gas fed to a region 962 within the plasma-generating chamber 942 proximate to the hot electrode 946. In operation, the plasma is generated in this region 962 and subsequently flows with the gas flow toward a nozzle 910 positioned at a distal end of the plasma-generating chamber 942.

According to another implementation, a piezoelectric material such as a suitable ceramic or polymer is positioned in the AP plasma source so as to enable the electrical output from the power supply to induce the piezoelectric effect. For example, the structure 950 shown in FIG. 9 may serve as the piezoelectric element. In this case, the electrical field impressed between the hot electrode 946 and the plasma-generating chamber 942 drives the structure to vibrate. The vibrations are transferred to the plasma and yield pressure waves in the plasma plume, which are utilized to impact a coated structure as described above. The piezoelectric material may be selected so as to match up with the drive frequency as closely as possible for optimizing the piezoelectric effect. Ideally, the drive frequency utilized creates a resonance condition (or other condition that promotes the piezoelectric effect) in the structure 950, although it will be appreciated that various off-resonant frequencies may be sufficient for producing pressure waves effective for the coating removal applications contemplated herein.

Figure 10:
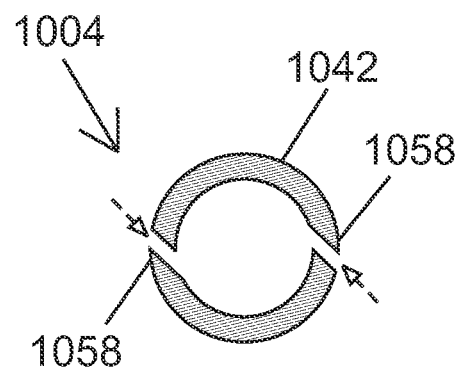
FIG. 10 is a cross-sectional view of another example of an AP plasma source, in transverse plane passing through gas inlets.

FIG. 10 is a cross-sectional view of another example of an AP plasma source 1004, in a transverse plane perpendicular to the flow of gases through an axially elongated plasma-generating chamber 1042. In this example, gas inlets 1058 are oriented at an acute angle (e.g., 45 degrees) relative to the central, longitudinal axis of the plasma-generating chamber 1042. By this configuration, gas is introduced into the AP plasma source 1004 with a significant tangential vector and consequently flows in the axial direction in a vortex flow pattern or path. The tangential gas inlets 1058 may be utilized in any of the implementations disclosed herein.

Figure 11:
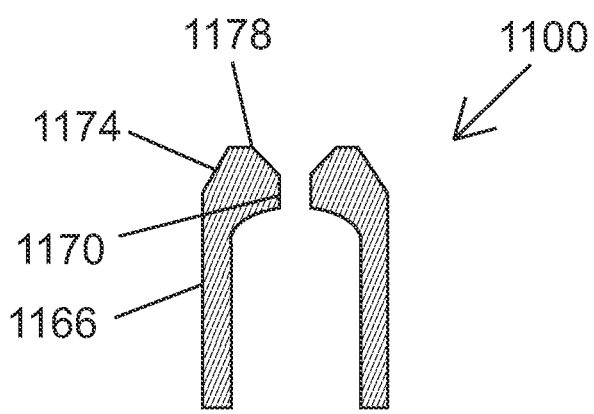
FIG. 11 is a cross-sectional view of an example of a nozzle that may be configured for producing shock waves or pressure waves in the plasma plume.

FIG. 11 is a cross-sectional view of an example of a nozzle 1110 that may be utilized in any of the implementations disclosed herein. In this example, the nozzle 1110 has a converging-diverging design. Specifically, the nozzle 1110 includes a first, converging section 1166 having an inside diameter that tapers down to a second, reduced-diameter section or throat 1170. The throat 1170 transitions to a third, diverging section 1174 having an inside diameter that increases to a larger-diameter nozzle exit 1178. The nozzle 1110 may be dimensioned appropriately as a means for producing pressure waves or shock waves as described above. Alternatively, the nozzle 1110 has only a converging design, i.e., lacks the diverging section 1174. Converging nozzles as well as converging-diverging nozzles have been found by the inventors to be effective for producing pressure waves under appropriate operating conditions.

In another implementation, an AP plasma source having a configuration similar to that shown in FIGS. 5 and 9, with a converging nozzle (i.e., a straight conical cross-sectional flow area without being followed by a diverging section), has been fabricated and evaluated. The AP plasma source repeatably and reliably produces a plasma plume characterized by shock waves, as evidenced by a clearly visible pattern of shock diamonds in the plasma plume, and achieved superior etch rates on coated samples as compared to conventional AP plasma sources unassisted by shock waves. The AP plasma source generated an air plasma using air at about room temperature as the feed gas. The air may be fed to an AP plasma source of this type at a pressure ranging from 30-110 psi and at a flow rate ranging from 1-7.5 CFM. In another example, the pressure range is 65-95 psi. In another example, the flow rate range is 1-4 CFM. Pressures higher than 110 psi may also be implemented to produce shock waves. In a more general example, the pressure may be 30 psi or greater and the flow rate may be 1 CFM or greater.

Figure 12:
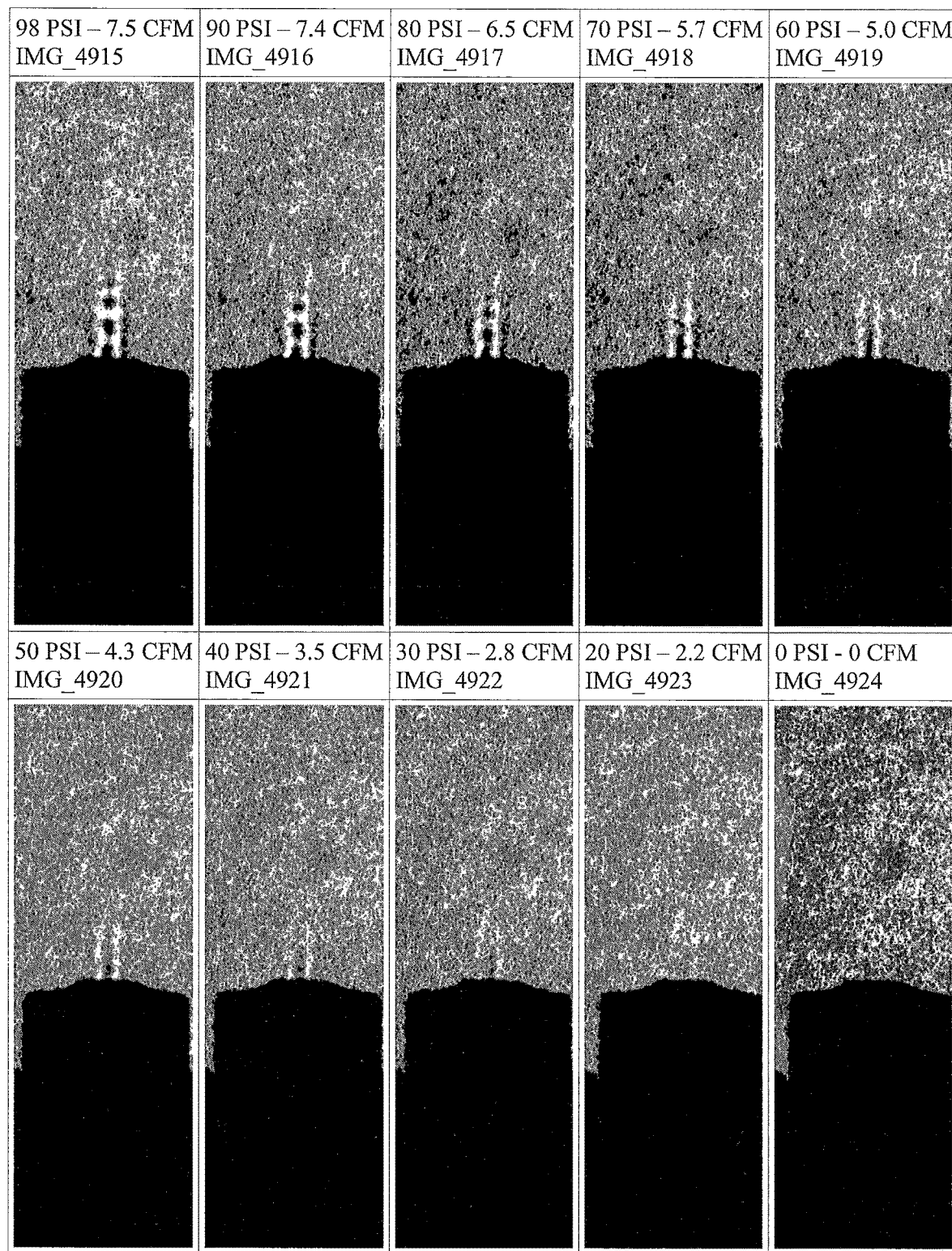
FIG. 12 is a set of shadowgrams of output flows from an AP plasma source at various air pressures and flow rates.

FIG. 12 is a set of shadowgrams (Schlieren images) of output flows from an AP plasma source at various air pressures and flow rates. In order, starting from the upper left image and ending with the lower right image, the conditions were: 98 psi and 7.5 CFM; 90 psi and 7.4 CFM; 80 psi and 6.5 CFM; 70 psi and 5.7 CFM; 60 psi and 5.0 CFM; 50 psi and 4.3 CFM; 40 psi and 3.5 CFM; 30 psi and 2.8 CFM; 20 psi and 2.2 CFM; and 0 psi and 0 CFM. In these examples, it can be seen that the shock waves are more visible or pronounced at the higher pressures and flow rates as compared to the lower pressures and flow rates.

Figure 13:
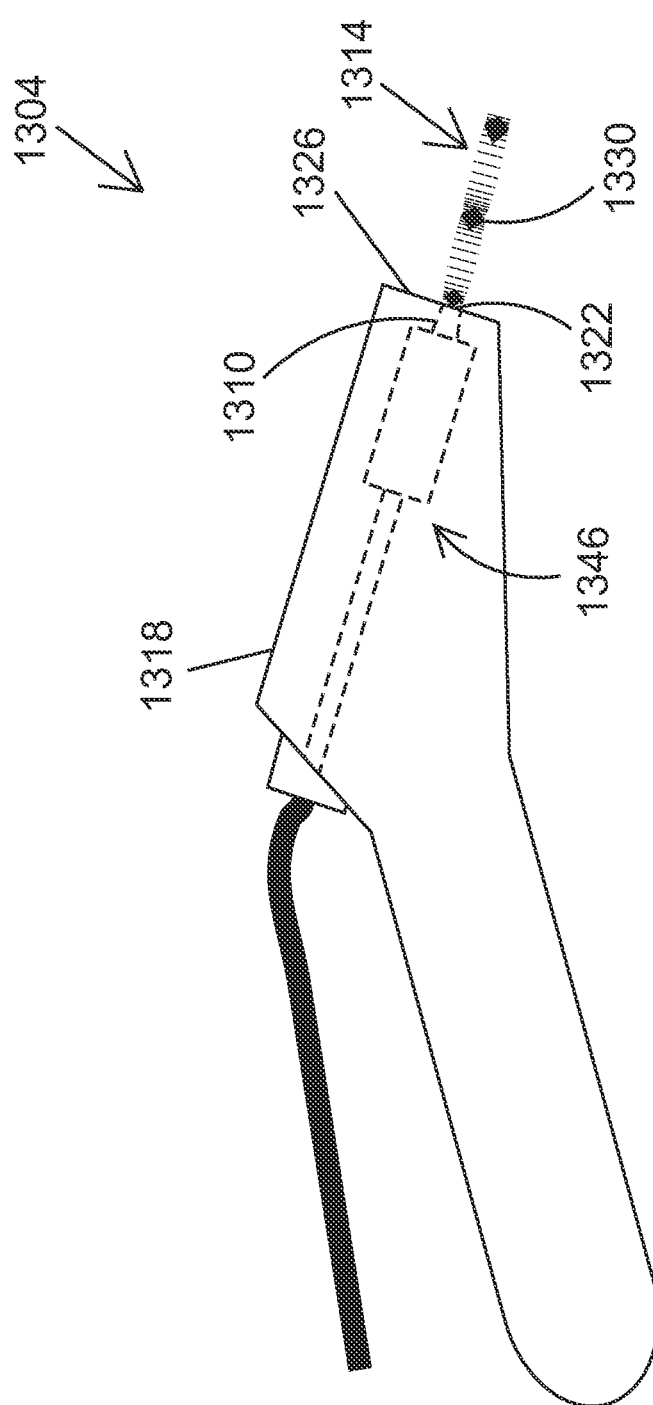
FIG. 13 is a side elevation view of another example of an AP plasma source according to another implementation.
Figure 14:
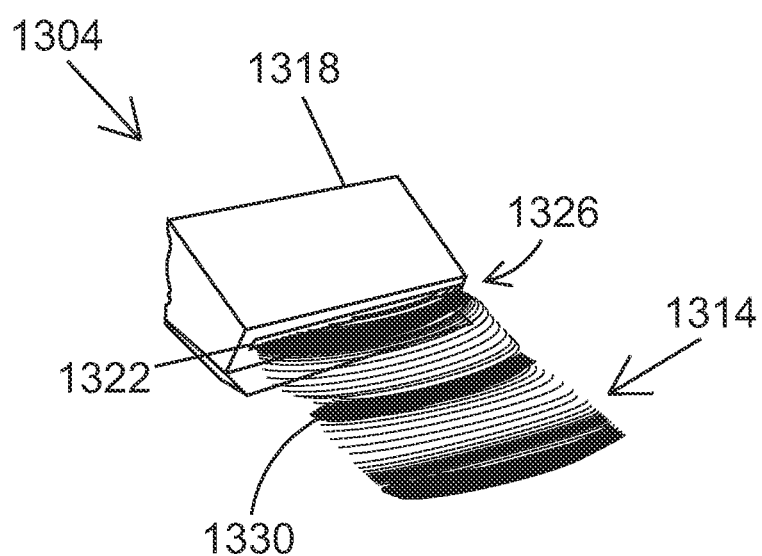
FIG. 14 is a front perspective view of the front portion of the AP plasma source illustrated in FIG. 13.

FIG. 13 is a side elevation view of another example of an AP plasma source 1304 according to another implementation. FIG. 14 is a front perspective view of the front portion of the AP plasma source 1304 illustrated in FIG. 13. The AP plasma source 1304 includes one or more plasma-generating units 1346 in a main body 1318 communicating with one or more nozzles (or a manifold) 1310. The nozzle(s) or manifold 1310 are set back in the main body 1318 and communicate with a slot-shaped plasma outlet 1322 that opens at a distal end 1326 of the main body 1318. By this configuration, the AP plasma source 1304 produces a wide, predominantly linear or horizontally-oriented plasma plume or "plasma line" 1314 with wide, predominantly linear or horizontally-oriented shock waves or pressure waves 1330.

While the foregoing description of implementations of the AP plasma source has focused primarily on material removal techniques, it will be understood that various implementations of the AP plasma source may be utilized for other operations such as, for example, surface treatment or functionalization.

Another potential application for the AP plasma source is in dentistry. With the correct etching chemistry of the plasma plume, the shock waves may be utilized to perform micro-etching of the hydroxyapetite within cavities or the surface of the teeth. A secondary effect would be the sterilization of the cavity or hole. This could possibly replace employing hard drills.

In general, terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. An atmospheric pressure plasma source comprising:
 a plasma-generating chamber for generating atmospheric pressure, non-thermal plasma, wherein the plasma-generating chamber defines an interior space including a plasma-generating region;
 a gas inlet for providing a flow path for plasma-generating gas to feed into the plasma-generating region;
 a powered electrode extending into the interior space of the plasma-generating chamber, wherein the powered electrode is at least partially within the plasma-generating region, configured to outlet the plasma to outside the plasma-generating chamber, wherein the powered electrode causes an electrical field to impress between the powered electrode and the plasma-generating chamber for generating vibrations of the plasma-generating chamber, wherein the vibrations are transferred to the plasma within the plasma-generating chamber for generating pressure waves in a plasma plume outlet from the plasma-generating chamber; and
 a plasma outlet communicating with the plasma-generating chamber for outletting the plasma plume.

2. The atmospheric pressure plasma source of claim 1, wherein the flowing means is configured for producing pressure waves in the plasma plume.

3. The atmospheric pressure plasma source of claim 2, wherein the pressure waves are shock waves.

4. The atmospheric pressure plasma source of claim 1, wherein the flowing means comprises a power source communicating with the electrode and configured for enabling adjustment of a drive frequency and a power level applied to the electrode to produce pressure waves in the plasma plume.

5. The atmospheric pressure plasma source of claim 1, wherein the flowing means is configured for flowing the plasma plume at a supersonic velocity and at a pressure different from an ambient pressure outside the plasma outlet.

6. The atmospheric pressure plasma source of claim 1, wherein the flowing means comprises a converging-diverging nozzle and the plasma outlet is an exit of the nozzle.

7. The atmospheric pressure plasma source of claim 1, wherein the flowing means comprises a piezoelectric element disposed in the chamber and configured for transferring vibrations to plasma generated in the chamber.

8. The atmospheric pressure plasma source of claim 1, wherein the flowing means comprises an air supply source configured for supplying air to the chamber at a pressure of 30-110 psi and at a flow rate of 1-7.5 CFM, and a converging nozzle, and wherein the plasma outlet is an exit of the nozzle.

9. An atmospheric pressure plasma source, comprising:
 a plasma-generating chamber;
 an electrode extending into the plasma-generating chamber;
 a converging nozzle communicating with the plasma-generating chamber; and
 an air supply source configured for supplying air to the chamber at a pressure of 30-110 psi and at a flow rate of 1-7.5 CFM.

10. The atmospheric pressure plasma source of claim 9, comprising a power source communicating with the electrode and configured for enabling adjustment of a drive frequency and a power level applied to the electrode to modulate pressure waves produced in a plasma plume flowing from the converging nozzle.

* * * * *